United States Patent [19]

Hutson

[11] 4,050,729
[45] Sept. 27, 1977

[54] APPARATUS FOR HANDLING DELICATE ARTICLES SUCH AS SILICON WAFERS

[76] Inventor: Clifford L. Hutson, 1860 Idlewood Road, Glendale, Calif. 91202

[21] Appl. No.: 678,469

[22] Filed: Apr. 20, 1976

[51] Int. Cl.$^2$ .............................................. B66C 1/02
[52] U.S. Cl. .................................................. 294/64 R
[58] Field of Search ........................ 294/2, 7, 24, 64 R, 294/64 A, 64 B; 248/362, 363; 269/21

[56] References Cited

U.S. PATENT DOCUMENTS

| 1,757,529 | 5/1930 | Jones | 294/64 R |
| 2,310,995 | 2/1943 | Robinson | 294/64 R |
| 3,272,549 | 9/1966 | Nisula | 294/64 R |
| 3,361,469 | 1/1968 | Yeager | 294/64 R |
| 3,517,958 | 6/1970 | Boucher et al. | 294/64 B |
| 3,843,183 | 10/1974 | Hutson | 294/64 R |

OTHER PUBLICATIONS

IBM Technical Disclosure Bulletin, vol. 9, No. 7, Dec. 1966, p. 950, "Vacuum Pick-up Device," Delgado and Sheiner.
Western Electric Technical Digest, No. 27, July 1972, p. 3, "Improved Vacuum Pick-up Tool for Semiconductor Wafers".

Primary Examiner—Johnny D. Cherry
Attorney, Agent, or Firm—Paul A. Weilein

[57] ABSTRACT

A tapered, generally triangular, rigid housing in which one angle forms a leading edge and the opposite side of the triangle forms a trailing edge. A vacuum attachment nozzle extends into the housing from the trailing edge toward the leading edge. A pliable suction cup is mounted and fixed in said housing by the vacuum nozzle which extends therethrough and is in fluid communication with the interior of a chamber in the suction cup. The exposed portion of the cup comprises a tapered, pliable, generally circular lip which extends slightly beyond one face of the housing. A plurality of wafer-contacting surfaces are located loosely adjacent the periphery of the lip, each spaced 120° from the adjacent suface. A lifting finger may be attached to the leading edge of the housing in order to pick up wafers which are stored on a horizontal surface and move the wafers onto the lip for grasping thereby.

19 Claims, 15 Drawing Figures

U.S. Patent    Sept. 27, 1977    Sheet 1 of 3    4,050,729
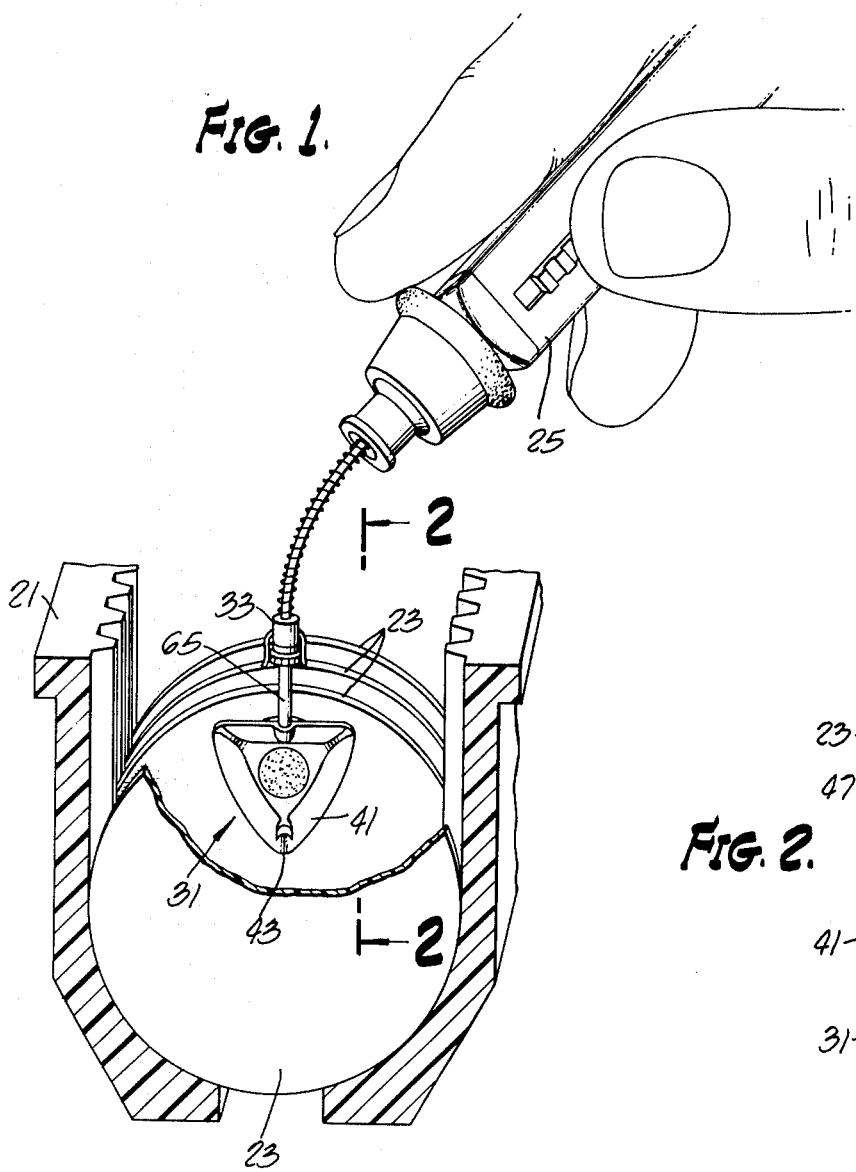
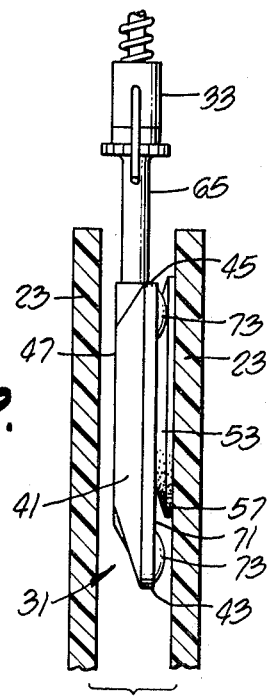
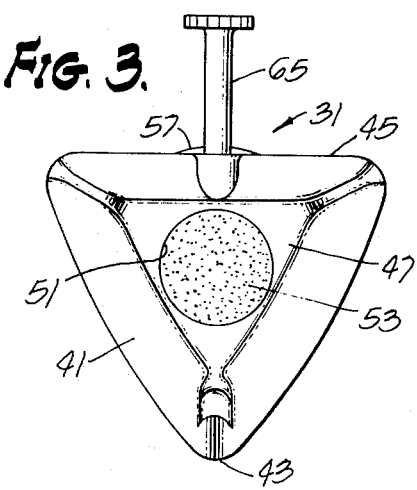
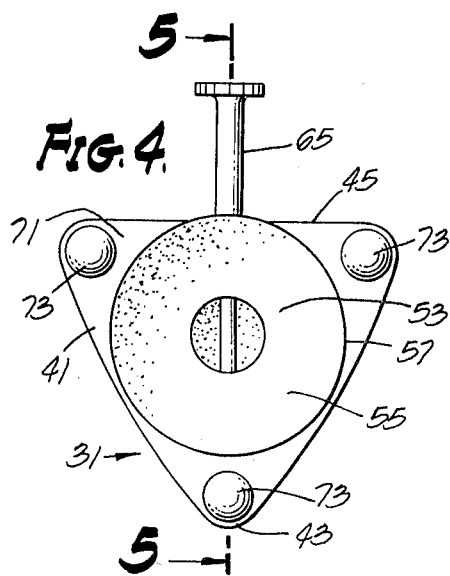

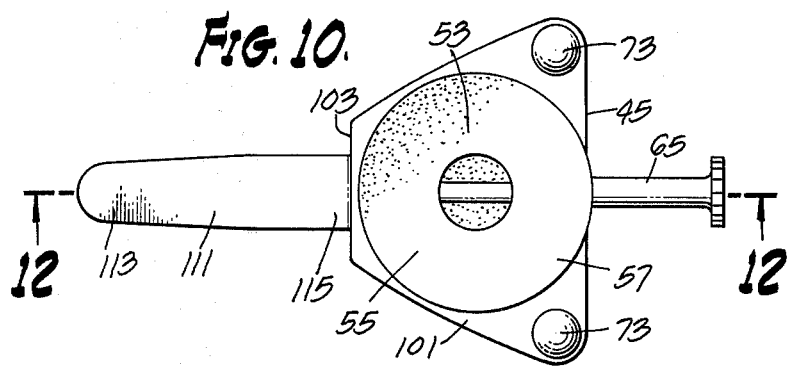
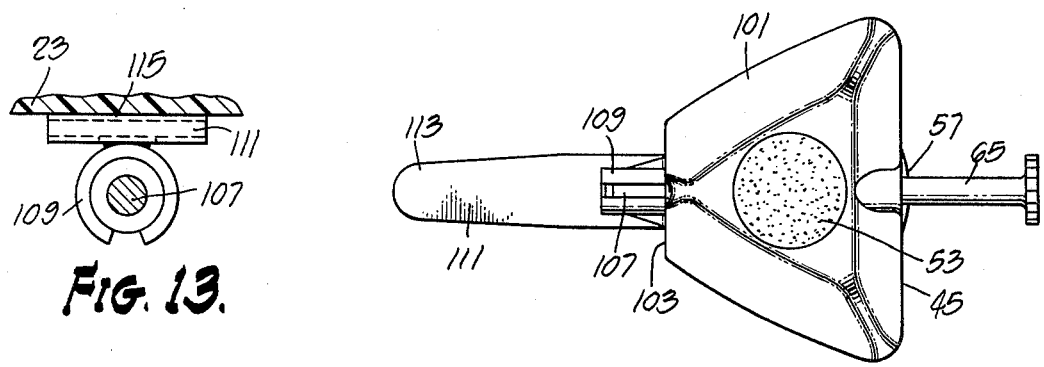
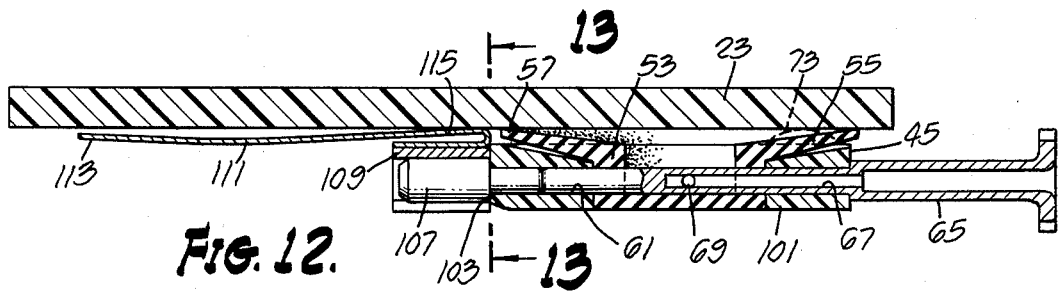
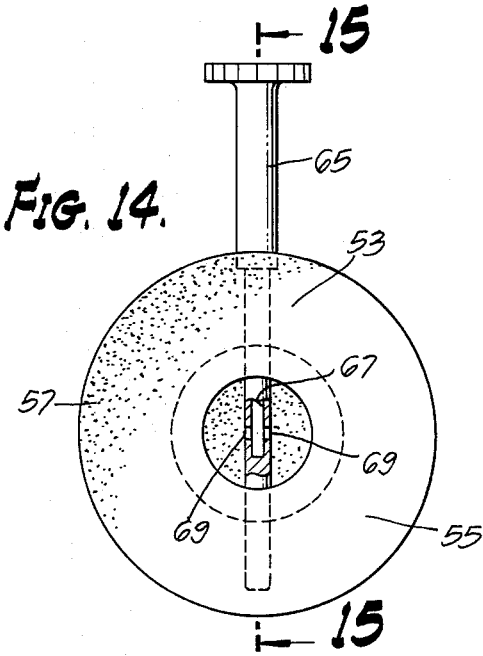
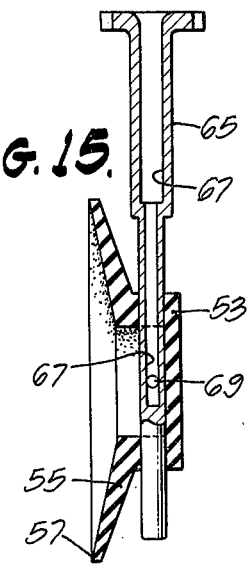

APPARATUS FOR HANDLING DELICATE ARTICLES SUCH AS SILICON WAFERS

BACKGROUND OF THE INVENTION

Although the following discussion will relate specifically to problems involved with the handling of silicon wafers, there is no intent to limit the applicability of the invention to such wafers. It should be understood that devices which employ the present invention may be utilized to handle, move, etc., any delicate device or structure which has a substantially flat surface, which surface need only be large enough to be gripped by the device.

In recent years, development of many products has moved very rapidly toward micro-technology, particularly in the field of electronics in which circuitry has become so reduced in size as to be literally indiscernable to the human eye without the aid of optical devices. In the development of this technology, printed circuitry has been imposed upon silicon wafers which must be handled, treated, etched, stored, and cut into discs or chips.

Such wafers are normally extremely thin and brittle and must be handled with extreme caution. Normally, the printed circuitry is positioned on one side of the wafer and extreme caution is necessary to prevent any marring, scratching, or contamination of the printed side of the wafer. Since the printing normally covers the full surface of the wafer, it is imperative that the printed side of the wafer not be touched, either by a hand which might contaminate it, or by any tool which could mar or scratch it.

In the past, a wide variety of tools have been developed to handle such wafers. For example, tweezers specifically designed for this purpose have been illustrated in U.S. Pat. Nos. 3,469,807; 3,665,790; and 3,741,602. While these tools can be successfully employed to handle a wafer, such success is extremely dependent upon the attention and caution of the worker handling the wafer. Since the wafer must be handled a number of times from its initial production through its ultimate use, the possibility of damage and total loss of a wafer increases accordingly, in spite of the designs of the prior art tools. This occurs because all of the prior art tools, such as tweezers, have one common feature: one prong of the tweezer must touch the printed surface of the wafer, causing that particular area of the wafer, at least, to be unusable. Similarly, since many of the tweezers are relatively hard and some have rather sharp jaws, there is an increased possibility of marring, scratching, or chipping the wafer.

Further, the prior art tools do not provide as positive a control and security in handling such wafers as is desirable in mass production techniques, unless highly paid, skilled technicians are employed to do the work.

In production, the wafers are treated in a variety of ways and, in some instances, are subjected to temperatures of as high as 500° C. The wafers must be maintained in a dust-free environment without contamination by the operator or his tools. They are often stored in "boats" which are slotted plastic containers in which the wafers are often located within 1/16 of an inch from one another. In such storage, the wafers are normally vertically oriented and, by analogy, resemble 35 mm film slides in their method of storage. It is mandatory that the wafer be moved in and out of the boat and through all other production steps without touching, contaminating, or marring it or the adjacent wafers. Also, during some stages of wafer fabrication, the wafers must be placed, with the printed side up, on a flat surface such as a tray or table.

In the past, in all of these circumstances the wafer had to be picked up by a tweezer or other similar tool. Thus, the chance of damaging a wafer was directly proportionate to the number of times which it had to be handled.

Consequently, it has become imperative to provide a tool which can be employed to quickly and easily handle a delicate article, such as the silicon wafer, without damaging the article and without requiring a high degree of skill by the worker just to handle that article.

SUMMARY OF THE INVENTION

The present invention relates to a tool which accomplishes all of these desired results so that an article such as a wafer may be quickly and easily moved, stored, etc., with the possibility of any damage substantially totally eliminated.

The present invention employs a vacuum source which can be applied to the back, or unprinted, side of a wafer (or similar article) to grip and firmly hold the wafer. At no time does any part of the tool enter into contact with the front, or printed, side of the wafer and thus it is impossible to damage or contaminate the front of the wafer.

In one preferred embodiment of the invention, a relatively rigid, substantially triangular, flat body or housing may carry and support a generally pliable suction cup which has a tapered lip extending therefrom. Preferably, the housing includes a plurality of contacting surfaces or buttons which cooperate with the lip to firmly grasp and hold a wafer when a vacuum is drawn from the chamber of the suction cup. A vacuum nozzle may pass through the suction cup in order to both draw the air therefrom, as well as to fix and hold the cup relative to the housing.

The vacuum nozzle may be mounted to any suitable source of suction but, if desired, it may be made particularly suitable for use with a vacuum pick-up instrument such as that shown in my prior U.S. Pat. No. 3,843,183. Using that instrument, the operator may selectively draw a vacuum from within the suction cup chamber in order to grasp or release a wafer, as desired.

A second embodiment of the present invention may be employed when it is desired to pick up a wafer from a tray or other flat surface. In such a case, the invention may include a lifting finger attached to the housing and extending away therefrom in such a manner as to aid the operator in lifting and directing the wafer into contact with the suction cup lip and the contacting surfaces thereabout. In this instance, if desired, a portion of the lifting finger may be employed in place of one of the workpiece-contacting surfaces or buttons on the housing.

Upon reading the following detailed description, taken together with the accompanying drawings, those skilled in the art will quickly appreciate that a wide variety of devices, many of which may be quite different in appearance but which, nevertheless, employ the present invention, may be utilized to grasp, hold, and move delicate articles. Thus, the description and illustration of the presently preferred embodiment should be considered to be exemplary only and not to delimit the present invention which is defined in the claims.

BRIEF DESCRIPTION OF THE DRAWINGS

In the drawings, which are to be regarded as merely illustrative:

FIG. 1 comprises an isometric illustration of the manner in which a tool formed in accordance with the present invention may be employed to handle a delicate article;

FIG. 2 comprises a side view of the tool depicted in FIG. 1, as seen along a line 2—2 thereof;

FIGS. 3 and 4 comprise enlarged plan views of the opposite faces of the tool;

FIGS. 10 and 11 are plan views of the opposite faces of the tool shown in FIG. 8;

FIG. 12 is a sectional view of this embodiment of the tool, as seen along a line 12—12 of FIG. 10;

FIG. 13 is a sectional view of a portion of the tool, as seen along a line 13—13 of FIG. 12;

FIG. 14 is a plan view, and FIG. 15 is a sectional view as seen along a line 15—15 of FIG. 14, of the tool with the housing removed so as to clearly illustrate the manner in which the suction cup may be held within the housing by the vacuum nozzle.

DETAILED DESCRIPTION

Figure 5:
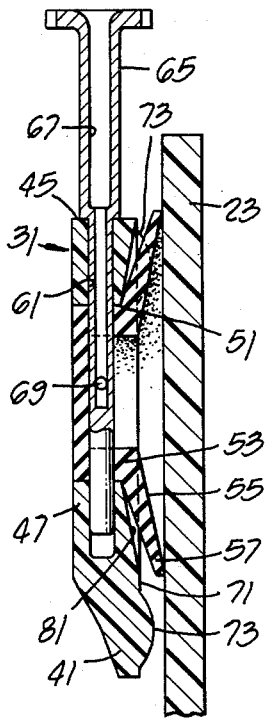
FIG. 5 comprises a side, sectional view of the tool, as seen along a line 5—5 in FIG. 4, illustrating the placement of the tool against an article to be handled prior to drawing a vacuum from the suction cup thereof.
Figure 6:
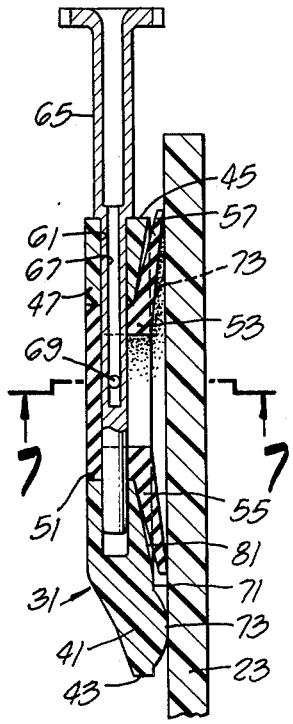
FIG. 6 is a view similar to FIG. 5 after a suction has been withdrawn from the cup.
Figure 7:
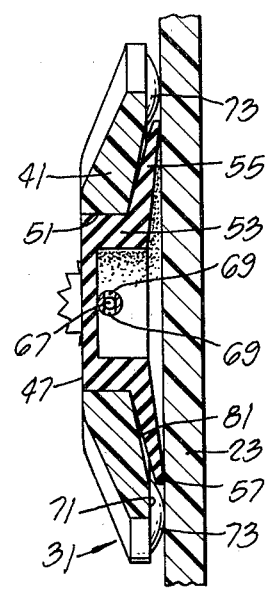
FIG. 7 is a sectional view of the tool as seen along a line 7—7 of FIG. 6.

There is shown in FIG. 1 a device 21, commonly called a "boat," in which a plurality of silicon wafers 23 may be stored in parallel, vertical positions. In many instances, the distance between adjacent wafers 23 is as small as 1/16 inch.

The hand of an operator is illustrated holding a vacuum pick-up instrument 25 which may, for example, be of the type illustrated and described in U.S. Pat. No. 3,843,183. In any event, whether that vacuum instrument or some other vacuum system is employed, the operator is acting to control a vacuum pick-up tool 31 which may, for example, be releasably connected to the instrument 25 by means of a spring clip gripping device 33.

For the sake of this illustrated discussion, it should be realized that the pick-up device 31 is normally positioned to cooperate with the rear, or unprinted side, of the silicon wafer, which has been illustrated as the side closest to the reader in FIG. 1 and on the left of the wafer as shown in FIG. 2. However, it will also be realized that the device embodying the present invention may be employed to pick up and handle any delicate article and, in this sense, the term "delicate" shall include any article which is subject to contamination, marring, scratching, chipping, etc., when maneuvered by hand, a tweezers, etc.

Referring now to FIGS. 3-7 together, it can be seen that this embodiment of the present invention comprises a relatively rigid, substantially triangular, flat housing 41 which may be construed as having a leading edge 43 and a trailing edge 45. The triangular shape of the housing and its thinness allows the housing to be easily inserted between the stacked wafers and engage the back or unprinted surface of the wafer without contacting or touching the printed surface of the adjacent wafer. As can be seen, the leading edge 43 and the sides of the triangular housing extending away therefrom may be tapered so as to be thinner than the central portion 47 of the body in order to allow the operator to thread the leading edge 43 between the wafers with greater ease.

A first bore 51 may extend all the way, or at least partially, through the central body portion 47 and a suction cup 53 may be located within the bore 51 in the manner illustrated. Preferably, the suction cup 53 may be provided with a radially extending, tapered portion 55 which terminates in a lip 57.

A second bore 61 may extend all the way or partially through the housing 41, preferably perpendicular to and intersecting the first bore 51 as shown. Also, preferably, the bore 61 extends beyond the outer periphery of the first bore 51 so that a vacuum nozzle 65 which passes through the bore 61 will also pass through coaxially aligned bores in the suction cup 53, thereby supporting and holding the suction cup within the housing. The perpendicularity of the nozzle bore 61 and the cup 53 results in compactness, i.e., thinness, of the tool to facilitate its use in small spaces.

The vacuum nozzle 65 may be provided with an axially extending fluid bore 67 which intersects one or more radially extending fluid bores 69 so as to withdraw air from within the suction cup when the vacuum tool is actuated.

With this structure, it is clear that the vacuum nozzle in no way impedes entry of the device into a space between adjacent wafers; it is perpendicular to the direction in which a vacuum may be applied to a wafer and extends through the trailing edge 45 of the housing to aid in directing the leading edge 43 into the space between wafers.

As seen particularly well in FIG. 4, the housing may have an article contacting face 71 having a plurality of contact surfaces 73. Although any number of such contact surfaces could be utilized, in the preferred embodiment it is seen that three such surfaces are employed, each near the apex of one of the angles of the triangular housing. The three such surfaces cooperate in the manner of a tripod to serve as points of contact between the housing and the article to be handled. Thus, in FIG. 5, it can be seen that the device 31 is installed adjacent the back of an article to be handled and pushed slightly thereagainst so that the flexible or pliable periphery of the lip 57 will enter into contact with the article to be handled. Then, when a vacuum is drawn through the nozzle 65, the contact surfaces 73 will be pulled toward the article and enter into contact therewith. This sequence of events is illustrated by a comparison of FIGS. 5 and 6. Also as illustrated in those figures, the contact face 71 of the housing 41 may include a tapered surface 81 for cooperation with the lip and the tapered portion 55 of the suction cup so that the housing and the suction cup may "collapse together" as the suction is applied.

The tripod effect generated by the contact surfaces 73 allows the device illustrated to be used to handle small, medium, and large size wafers with a maximum of control and safety for the wafer.

Thus, in operation, the device 31 is located adjacent the unprinted surface and is pressed lightly thereagainst as illustrated in FIGS. 2 and 5. A vacuum is then drawn through the nozzle 65, causing the housing to collapse against the tapered portion of the suction cup until the contact surfaces 73 abut the unprinted surface of the wafer. Then, the operator can move and position the wafer in any desired position without touching it and the device 31 cannot damage the wafer in any way.

As is clearly shown in FIG. 4, the contact surfaces 73 may be closely positioned to the periphery of the lip 57, and the lip 57 extends beyond an imaginary triangle which may be drawn to connect the contact surfaces. In this manner, the housing fully supports the suction cup and, simultaneously, provides a tripod-type holding of the wafer in such a manner that the wafer cannot rock and tilt relative to the housing, thus increasing the tolerance limits when the housing is produced.

For the convenience of the reader, FIGS. 14 and 15 have been set forth to clearly illustrate the passage of the vacuum nozzle 65 through the coaxial apertures on opposite sides of the central portion 53 of the suction cup, thus illustrating the manner in which the nozzle passes through the cup and supports and fixes it within the body 41.

Turning now to FIGS. 8-11, those elements which are substantially identical in configuration and function to those of the first embodiment have been provided with identical identification numerals and no further discussion thereof is necessary here.

As shown in these figures, a housing 101 may be substantially triangular in shape, but having a truncated leading edge 103 as illustrated. Referring particularly to FIGS. 12 and 13, it can be seen that the bore 61 into which the vacuum nozzle 65 is installed may traverse the entire housing and be open at the leading edge 103 thereof. a pin 107 may be installed in the opening of the bore 61 at the leading edge 103 in order that a partially circular portion 109 of a finger 111 may be attached thereto.

Figure 8:
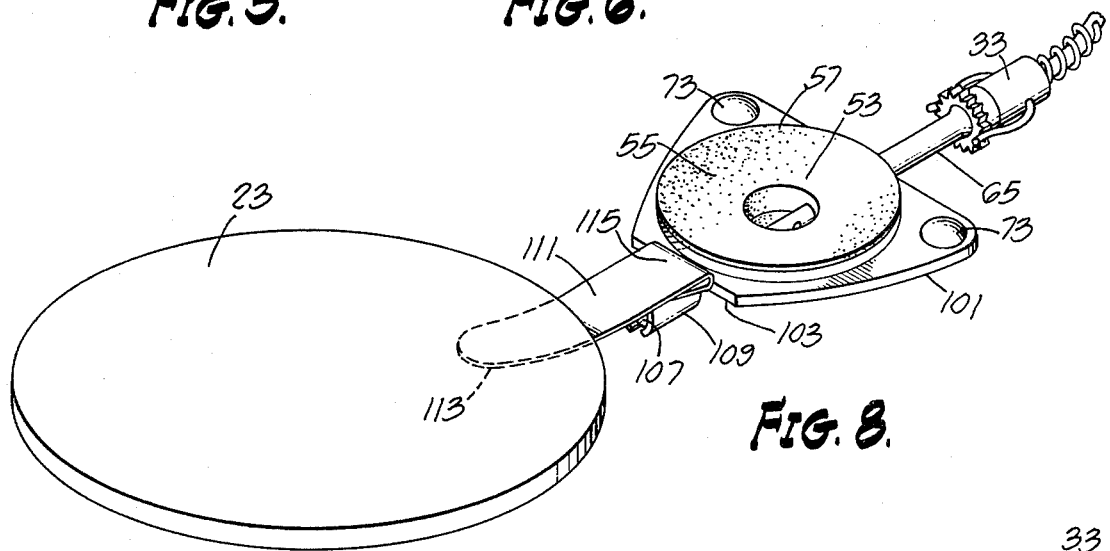
FIG. 8 comprises an isometric illustration of a second embodiment of the present invention.
Figure 9:
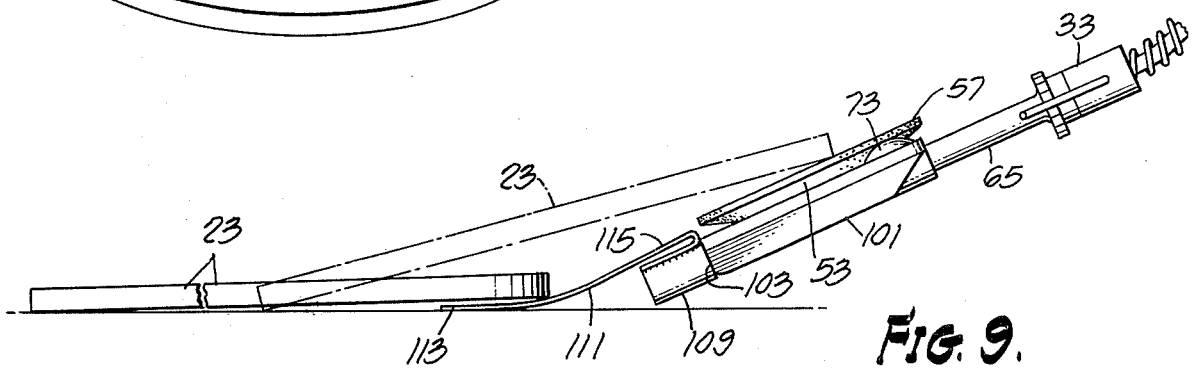
FIG. 9 is a side view of the tool shown in FIG. 8.

As illustrated, the leading end or tip 113 of the finger may be bent slightly so as to extend above a plane including the suction cup lip 57. Thus, as illustrated in FIG. 8 and 9, the operator may maneuver the tip 113 of the finger 111 beneath a wafer, which has been set upon a flat, substantially horizontal surface. He may then use the finger to lift the wafer, insert the device against its unprinted surface and then evacuate the suction cup.

Thus, while the first embodiment is very suitable for handling wafers which are stacked in a vertical position, a device formed in accordance with the second embodiment will also allow wafers located in a horizontal position to be releasably attached to the device for handling and movement without requiring the wafer to be touched either by the operator's fingers or a tool which could mar or chip the wafer.

Preferably, the finger 111 may be formed from a thin, flexible metallic substance and located on the pin 107 in such a manner than a portion 115 of the finger will act as a contact surface to cooperate with the other contacting surfaces 73 in the tripod fashion previously described. Also, the finger may be tapered and rounded at its leading edge 113 to facilitate its insertion under a wafer lying flat on a tray or surface with its printed side up. Of course, it will be realized by those skilled in the art that, under certain circumstances, it will be necessary to push the wafer against some other tool or instrument to keep it from sliding when the finger is pushed beneath its unprinted surface as illustrated in FIG. 9.

Of course, those skilled in the art will realize that a finger of this or any similar nature may be fastened to the housing in any manner desired, and further that many other modifications of these embodiments are possible without exceeding the scope of the invention, which is now set forth in the following claims.

I claim:

1. Apparatus for picking up and handling silicon wafers and the like, comprising:
    a rigid housing configured to be movable edgewise between closely adjacent wafers;
    means in said housing defining an open vacuum chamber which terminates in a deflectable surface-contacting peripheral lip extending adjacently over a side face of the housing; and
    means in said housing, connectable to a vacuum source and extending into said vacuum chamber in a plane substantially parallel to the plane including said lip, for generating a vacuum in said vacuum chamber.

2. The device of claim 1, wherein said housing further includes a plurality of distinct material contacting surfaces on said side face of the housing, said surfaces being located in predetermined positions outside the periphery of said lip.

3. The device of claim 2, wherein said lip is substantially circular, said surfaces are located in three angularly equal positions about said lip, and said lip extends radially outwardly beyond an imaginary triangle formed by said surfaces.

4. The apparatus of claim 1, wherein said vacuum chamber means comprises pliable means mounted in said housing and extending in tapered form to said lip, the latter being located closely adjacent to, but outside of, said side face of said housing.

5. The apparatus of claim 4, wherein said vacuum generating means extends through said pliable means for holding the latter in said housing.

6. A device for handling delicate articles, comprising:
    a housing including a material contacting face;
    suction cup means mounted in said housing having a vacuum chamber therein and a lip substantially parallel to and adjacent said material contacting face, said lip defining an open boundary of said vacuum chamber within said cup;
    vacuum nozzle means mounted in said housing in fluid communication with said vacuum chamber;
    said housing further including a plurality of distinct material contacting surfaces on said material contacting face, said surfaces being located in predetermined positions outside the periphery of said lip; and
    at least one of said surfaces comprising a portion of a substantially flexible, article lifting finger attached to and extending outwardly from said housing.

7. The device of claim 6, wherein said finger comprises a thin, flexible member extending above the plane of said material contacting face away from said housing.

8. A device for handling delicate articles, comprising:
    a housing including a material contacting face;
    suction cup means mounted in said housing having a vacuum chamber therein and a lip substantially parallel to and adjacent said material contacting face, said lip defining an open boundary of said vacuum chamber within said cup;
    vacuum nozzle means mounted in said housing in fluid communication with said vacuum chamber;
    said housing further including a first bore in which said suction cup is mounted, and a second bore, intersecting and extending outwardly from said first bore; and said vacuum nozzle means being positioned in said second bore and extending through said suction cup in said first bore for fixing and supporting the suction cup in said housing.

9. Apparatus for picking up and handling silicon wafers and the like, comprising:
a housing suitably configured to be easily moved between closely adjacent wafers, and comprising a substantially flat, triangular body having a tapered edge about at least a portion of the periphery thereof;
means in said housing defining an open vacuum chamber which terminates in a surface-contacting lip; and
means mounted in said housing generally perpendicular to one edge of said triangular body and extending toward an angular tip thereof, and being connectable to a vacuum source and extending into said vacuum chamber in a plane substantially parallel to the plane including said lip, for generating a vacuum in said vacuum chamber.

10. The apparatus of claim 9, wherein said vacuum chamber means is substantially perpendicularly oriented relative to said vacuum generating means, the latter extending through the former so as to support said chamber means in said housing.

11. Apparatus for picking up and handling silicon wafers and the like, comprising:
a housing suitably configured to be easily moved between closely adjacent wafers;
means in said housing defining an open vacuum chamber which terminates in a surface-contacting lip which includes radially tapered, pliable, generally circular means extending about an axis of said vacuum chamber;
means in said housing, connectable to a vacuum source and extending into said vacuum chamber in a plane substantially parallel to the plane including said lip, for generating a vacuum in said vacuum chamber;
said housing including three surface-contacting portions closely adjacent said lip and located at equal angularly related positions thereabout; and
finger means mounted on said housing and extending outwardly therefrom and above the plane of said lip for aiding in positioning a wafer against said lip.

12. The apparatus of claim 11, wherein said finger means includes a portion thereof which forms one of said surfacecontacting portions.

13. A device for handling delicate articles, comprising:
a housing of generally flat, triangular configuration having a first face and a second face;
a distinct material contacting surface on one of said faces of said housing near each angle of said triangular housing, one of said angles of said housing defining a leading edge and the opposite side of said triangular housing defining a trailing edge;
a first bore in said housing extending from said trailing edge toward said leading edge;
a second bore in said housing extending from said one of said faces toward the other of said faces and intersecting said first bore;
article grasping means mounted in said second bore including a vacuum chamber, and a pliable lip extending about said vacuum chamber located near and extending substantially parallel to said one of said faces; and
vacuum means, in said first bore, connectable to an air suction apparatus and extending into said vacuum chamber, including means in said vacuum chamber for placing said vacuum chamber and said vacuum means in fluid communication.

14. The device of claim 13, wherein said leading edge of said housing is tapered to aid in insertion of said device between closely spaced delicate articles.

15. The device of claim 13, wherein said leading edge includes finger means mounted thereon and extending outwardly therefrom to aid in lifting a delicate article onto said lip.

16. The device of claim 15, wherein said finger means includes means forming one of said distinct material contacting surfaces.

17. The device of claim 13, wherein said material contacting surfaces are located closely adjacent said lip such that said lip extends beyond an imaginary triangle joining said surfaces.

18. The device of claim 13, wherein said second bore extends beyond said first bore in both directions and said vacuum means passes through said grasping means to fix and support the latter in said housing.

19. The device of claim 18, including:
pin means mounted in that portion of said second bore nearest said leading edge and extending outwardly from the latter; and
finger means mounted on said pin means and extending outwardly from said housing for aiding in lifting an article to be handled onto said lip.

* * * * *